United States Patent [19]
Arumugham et al.

[11] 3,944,725
[45] Mar. 16, 1976

[54] WIDE BAND AUTOMATIC FREQUENCY CONTROL CIRCUIT

[75] Inventors: Rangaswamy Arumugham, Batavia, N.Y.; William Frank Kruszewski, Belle Aire, Fla.; Karol Siwko, Batavia, N.Y.

[73] Assignee: GTE Sylvania Incorporated, Stamford, Conn.

[22] Filed: Feb. 28, 1975

[21] Appl. No.: 554,316

Related U.S. Application Data

[63] Continuation of Ser. No. 397,591, Sept. 14, 1973.

[52] U.S. Cl. .............................. 178/5.8 AF; 325/418
[51] Int. Cl.² .......................................... H04N 7/06
[58] Field of Search ................... 178/5.8 AF, 5.8 R; 325/418, 419, 420, 421, 422, 423; 331/18, 20

[56] References Cited
UNITED STATES PATENTS

| | | | |
|---|---|---|---|
| 2,962,666 | 11/1960 | Pollak | 331/20 |
| 3,632,864 | 1/1972 | Evans | 178/5.8 AF |
| 3,733,432 | 5/1973 | Arimura | 178/5.4 CD |
| 3,796,824 | 3/1974 | Baker | 178/5.8 AF |
| 3,858,000 | 12/1974 | Merriweather | 178/5.8 AF |

*Primary Examiner*—Richard Murray
*Assistant Examiner*—Michael A. Masinick
*Attorney, Agent, or Firm*—Norman J. O'Malley; Thomas H. Buffton; Robert E. Walrath

[57] ABSTRACT

An automatic frequency control (AFC) circuit for a signal receiver having a tuner, intermediate frequency (IF) amplifier, video amplifier, and sync pulse separation means includes a discriminator coupled to the IF stage and a signal combining means coupled to the discriminator means and sync pulse separation means and to the tuner to effect a given "pull-in" range for the tuner in response to error signals from the discriminator and an increased "pull-in" range upon loss of sync signals from the sync pulse separation means when the tuner stage is increasingly detuned.

9 Claims, 4 Drawing Figures

WIDE BAND AUTOMATIC FREQUENCY CONTROL CIRCUIT

This is a continuation of application Ser. No. 397,591, filed Sept. 14, 1973.

BACKGROUND OF THE INVENTION

Normally, signal receivers and particularly television signal receivers employ an automatic frequency control (AFC) circuit wherein a tuner stage includes the usual mixer and oscillator stage and a received signal is heterodyned to provide a signal at a so-called intermediate frequency or IF signal. This IF signal is applied to a group of IF amplifier stages and to a discriminator tuned to a given frequency. Any deviation in the signal from the tuned frequency provides an error or AFC correction signal. In turn, the error signal is coupled back to the oscillator of the tuner in a manner such that the oscillator tuning is altered to reduce the frequency deviation of the signal applied to the IF stages with respect to the tuned frequency of the discriminator stages.

Although the above-mentioned AFC circuitry has been and still is utilized in numerous applications with a great deal of success, it has been found that the presettability of many present-day tuners and particularly 70 detent tuners is frequently insufficient when such circuitry is employed. More specifically, it has been found that AFC systems employing a discriminator tend to provide an error signal having a "pull-in" range limited to a small portion of the discriminator response curve.

For example, apparatus having an adjacent carrier signal, such as the sound carrier in a TV receiver, provides an error correction response which tends to push the oscillator of the tuner stage away from rather than toward the desired tuning when the discriminator response curve has a negative-going slope. Also, apparatus employing a DC amplifier for the error voltage does not always have an amplifier bias voltage and an error signal quiescent voltage which coincide. Thus, the system will tend to "block" due to this non-coincident operation condition when the discriminator response is a negative-going slope and is of a magnitude less than the difference between the above-mentioned bias and quiescent potentials.

As a result, normal AFC systems utilizing discriminator type circuitry do not normally provide a wide band "pull-in" range. Moreover, wide band "pull-in" is a highly desirable condition in AFC systems when tuners, seventy detent or others, with limited presettability capabilities are employed.

OBJECTS AND SUMMARY OF THE INVENTION

An object of the present invention is to provide an enhanced automatic frequency control (AFC) circuit for a signal receiver. Another object of the invention is to provide an AFC circuit having an improved "pull-in" range. Still another object of the invention is to provide an AFC circuit utilizing potentials from sync pulse separation means to enhance the "pull-in" range of the system. A further object of the invention is to utilize discriminator means and sync pulse separation means to improve the "pull-in" range of the system. A further object of the invention is to utilize discriminator means and sync pulse separation means to improve the "pull-in" range of an AFC system.

These and other objects and advantages are achieved in one aspect of this invention by an automatic frequency control circuit for a television receiver having an intermediate frequency amplifier stage coupled to a tuner stage and by a detector stage to a video amplifier stage connected to a cathode ray tube. The automatic frequency control circuit includes discriminator means coupled to the intermediate frequency amplifier stage, means coupled to the video amplifier stage for detecting sync pulses, and signal combining means. The signal combining means is coupled to the discriminator means, the means for detecting sync pulses, and the tuner stage. The signal combining means effects a given "pull-in" range of the tuner stage in response to error signals from the discriminator means and an increased "pull-in" range in response to a signal from the means for detecting sync pulses indicative of the absence of detected sync pulses.

DESCRIPTION OF THE PREFERRED EMBODIMENT

For a better understanding of the present invention, together with other and further objects, advantages and capabilities thereof, reference is made to the following disclosure and appended claims in conjunction with the attached drawings.

Figure 1:
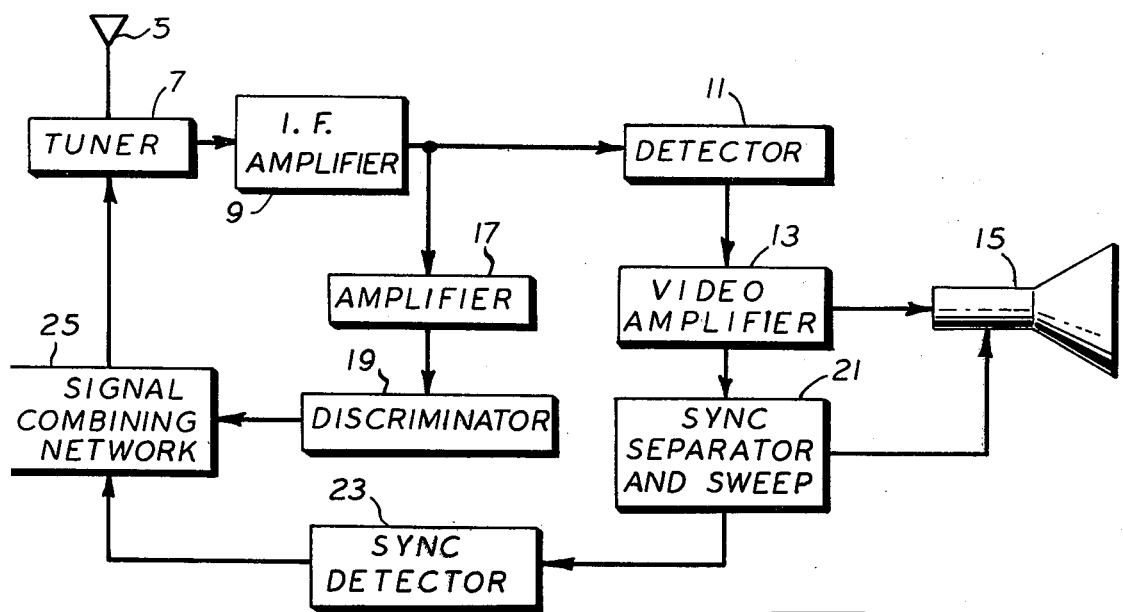
FIG. 1 is a block diagram illustrating an embodiment of the invention.

In the drawings, the block diagram of FIG. 1 illustrates a television receiver having an antenna 5 for intercepting broadcast signals. A tuner stage 7 including an amplifier, a mixer, and an oscillator is coupled to the antenna 5 and to one or more of the IF amplifier stages 9. In the usual manner, the tuner stage 7 heterodynes the intercepted signal to provide an IF signal which is applied to the tuned IF stages 9.

A signal from the IF amplifier stages 9 is applied to a series connected detector stage 11, a video amplifier stage 13, and a cathode ray tube 15 to provide a visual display. The signal from the IF stages 9 is also applied by way of an amplifier stage 17 to an AFC discriminator stage 19. Also, a signal from the video amplifier stage 13 is applied to a sync pulse separation means 21 which, in turn, is coupled to the cathode ray tube 15 and to a sync pulse detection means 23.

A signal combining means 25, in the form of an amplifier stage in this instance, couples the discriminator means 19 and the sync pulse detector means 23 to the tuner stage 7 of the signal receiver. Thus, error signals are provided by the discriminator means 19 for input signals from the tuner deviating from the frequency of the discriminator stage 19 while a potential representative of sync pulse signals is provided by the sync pulse detector means 23. Moreover, the error signals and sync pulse potential are combined at proper instances of "de-tuning" and applied to the tuner stage 7 to effect an enhanced "pull-in" range of the AFC circuit.

Figure 2:
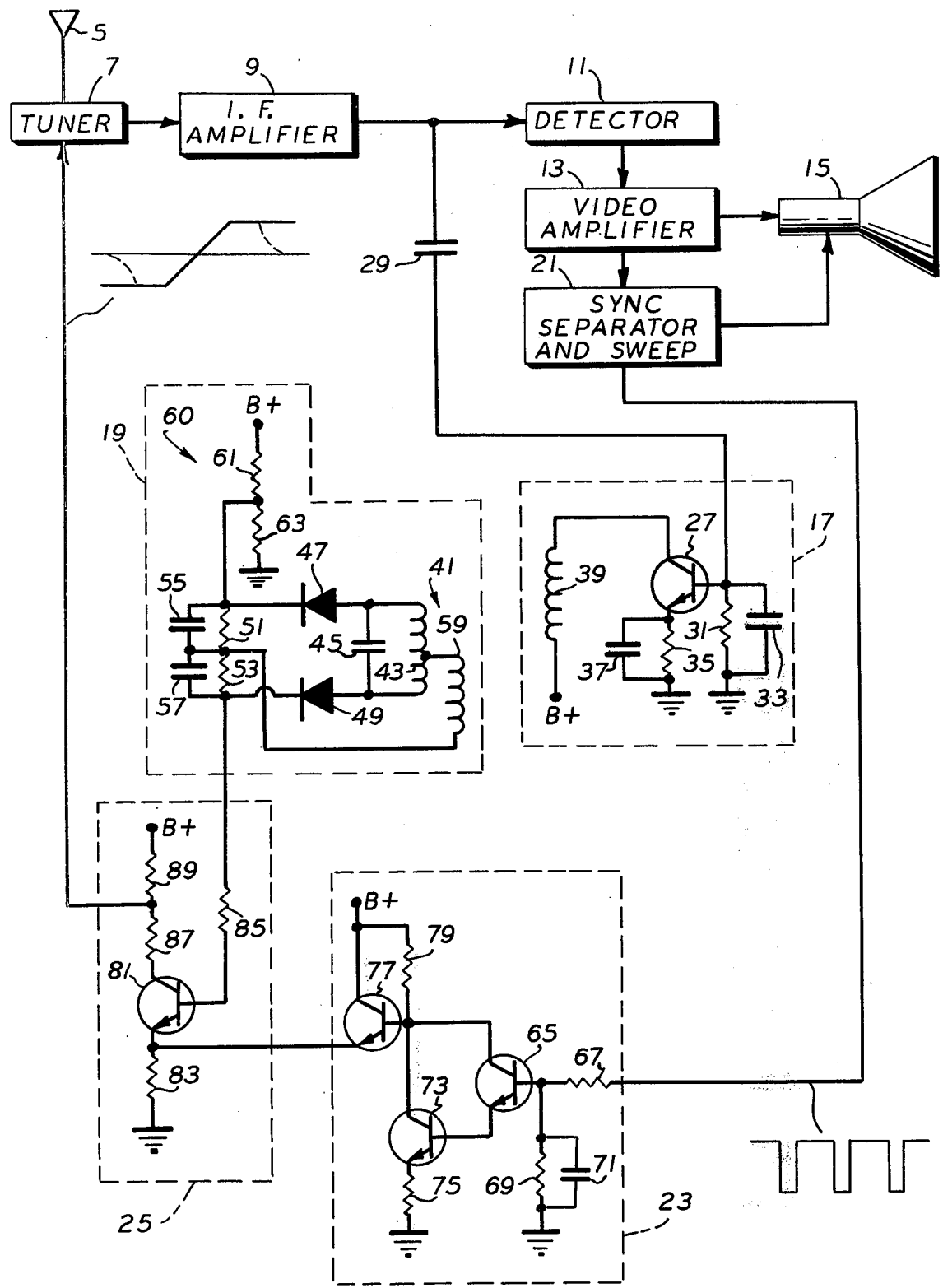
FIG. 2 illustrates, in block and schematic form, an embodiment of the AFC system of FIG. 1.

More specifically, FIG. 2 illustrates a television receiver having an antenna 5 coupled to tuner stage 7 which is, in turn, coupled to an IF amplifier stage 9.

The IF amplifier stage 9 provides an output which is coupled to a detector stage 11 connected to a video amplifier stage 13 coupled to a cathode ray tube 15.

The output of the IF amplifier stage 9 is also coupled to an amplifier stage 17 connected to the AFC discriminator stage 19. Also, the output of the video amplifier stage 13 is connected to a sync separator means coupled to the cathode ray tube 15 and to a sync pulse detector means 23. In turn, a signal combining means 25 is coupled to the AFC discriminator means 19, the sync pulse detector means 23 and to the tuner stage 7.

In this embodiment, the amplifier stage 17 is in the form of a transistor 27 having a base electrode coupled to the output of the IF amplifier stage 9 by a capacitor 29 and to circuit ground by a parallel connected resistor 31 and capacitor 33. An emitter electrode is also coupled to circuit ground by a parallel connected resistor 35 and capacitor 37 while the collector electrode is coupled to a potential source B+ by a primary winding 39 of a transformer 41.

The discriminator means 19 includes a secondary winding 43 of the transformer 41 shunted by a capacitor 45 and each end of the secondary winding 43 is connected to a diode, 47 and 49 respectively. The diodes 47 and 49 are interconnected by series connected resistors 51 and 53 each shunted by a capacitor, 55 and 57. The junction of the resistors 51 and 53 and the capacitors 55 and 57 is coupled by a tertiary winding 59 of the transformer 41 to the center of the secondary winding 43. Also, the junction of the diode 47 and resistor 51 and capacitor 55 is coupled to a bias development means 60 including a pair of resistors 61 and 63 series connected to a potential source B+ and to a potential reference level or circuit ground.

The output of the sync separator means 21 is applied to the sync pulse detector means 23 which, in this instance, is in the form of a Darlington switch having a first transistor 65 with a base electrode coupled by a resistor 67 to the sync separator means 21 and by a parallel connected resistor 69 and capacitor 71 to circuit ground. Obviously, the detector means 23 may be in the form of a single transistor or a combination of bipolar or FET type transistors for example. The emitter electrode is connected to the base of a second transistor 73 having an emitter connected to circuit ground by a resistor 75. The collectors of both transistors 65 and 73 are connected to the base of a third transistor 77 and by a resistor 79 to a potential source B+. The collector of the third transistor 77 is coupled to the potential source B+ and to the emitter electrode of a transistor 81 of the signal combining means 25.

This transistor 81 of the signal combining means 25 has an emitter electrode which is also connected to circuit ground by resistor 83. The base electrode is coupled by a resistor 85 to the junction of the diode 49, resistor 53, and capacitor 57 of the discriminator means 19. The collector electrode is coupled by a resistor 87 to the tuner stage 7 of the signal receiver and by another series connected resistor 89 to the potential source B+.

Figure 3:
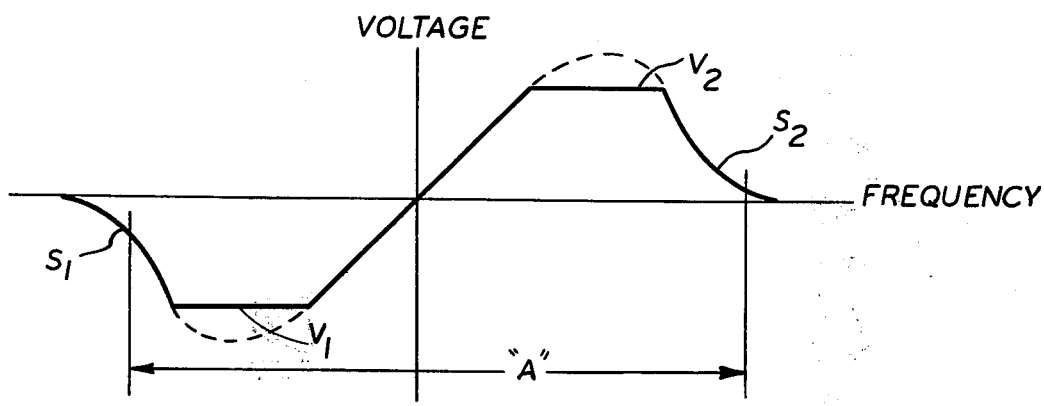
FIG. 3 illustrates the error correction voltage characteristic curve of an ordinary prior art AFC circuit.

As to operation, FIG. 3 illustrates an unbalanced error potential developed by a normal or usual type AFC circuit. A received signal is heterodyned in a tuner, which is slightly de-tuned, and provides an output signal which deviates slightly from the tuned frequency of the discriminator stage. The IF stages amplify the signal and provide an output to a discriminator means whereby an error signal, FIG. 3, having a "pull-in" range A is provided.

As can be seen in the prior art curve of FIG. 3, an ordinary AFC circuit has a blocking-free pull-in range A which is determined by the tuner sensitivity and the location and strength of adjacent carriers. Moreover, the curve may be non-coincident with the quiescent voltage, if there is any.

It can be readily understood that negative-going slope segments $S_1$ and $S_2$ provide potentials to a tuner stage which are opposite to a desired polarity and which may tend to push the oscillator tuning away rather than toward the desired or correct tuning frequency $f_o$. Such a condition is frequently encountered when signals other than a picture carrier signal are present or when the tuner amplifier bias and quiescent potential of the error signal differ.

As previously mentioned, many receivers and particularly those employing 70 detent tuner stages have a presettability problem whereby an increased "pull-in" range is desirable and required for satisfactory operation. Thus, the AFC circuitry set forth in FIG. 2 becomes appropriate.

More specifically, a signal received by the tuner stage 7 of FIG. 2 is heterodyned to provide an IF signal which is applied to and slightly deviates in frequency from the tuned frequency of the discriminator stage 19. The IF stages 9 provide an amplified output representative of this deviation in frequency from the tuned discriminator frequency and this output is applied via an amplifier stage 17 to the discriminator means 19.

Figure 4:
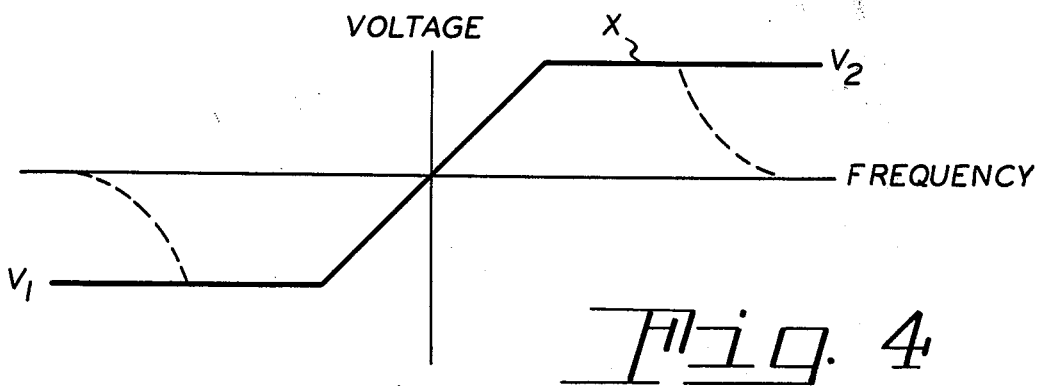
FIG. 4 is an error correction voltage characteristic curve of the embodiment of FIG. 2.

The discriminator means 19 includes a bias development means 60 which is preselected such that a signal combining means 25 is in a state of saturation conduction for error signals below the correct tuning frequency, $f_o$ of FIG. 4. Thus, a steady state output $V_1$ having a frequency "pull-in" which exceeds the ordinary AFC system of FIG. 3 is provided. The pull-in range is limited only by the tuner sensitivity and it is insensitive to noncoincidence of the quiescent potential.

Also, error signals above the correct tuning frequency $f_o$ ordinarily reach a steady state level $V_2$ and then follow a negative slope as illustrated in FIG. 3. However, at a given frequency of de-tuning, $x$ of FIG. 4, the sync signals normally available to the sync pulse separation means 21 are no longer available. Thereupon, the output potential available from the sync detector 23 and applied to the signal combining means 25 is lost. Upon loss of the potential from the sync detector 23, the signal combining means 25 is rendered non-conductive or turned off whereupon the steady state potential, essentially B+ or $V_2$, is maintained and the "pull-in" range greatly extended.

Thus, there has been provided a unique wide band AFC circuit for a signal receiver. The circuit is inexpensive of components and structure while enhancing the signal frequency "pull-in" capabilities of the signal receiver. Moreover, undesired blocking of the system for negative-going slope characteristics has been virtually eliminated without deleterious effect upon circuit operation.

While there has been shown and described what is at present considered the preferred embodiment of the invention, it will be obvious to those skilled in the art that various changes and modifications may be made therein without departing from the invention as defined by the appended claims.

What is claimed is:

1. In a television receiver having an intermediate frequency (IF) amplifier stage coupled to a tuner stage and by a detector stage to a video amplifier stage connected to a cathode ray tube, an automatic frequency control (AFC) circuit comprising:
   discriminator means coupled to said IF amplifier stage for providing an error signal in response to signals deviating from the tuned frequency of said discriminator means;
   means coupled to said video amplifier stage for detecting sync pulses; and
   signal combining means coupling said discriminator means and said means for detecting sync pulses to said tuner stage for effecting a given "pull-in" range of said tuner stage in response to error signals from said discriminator means and an increased "pull-in" range in response to a signal from said means for detecting sync pulses indicative of the absence of detected sync pulses.

2. An automatic frequency control (AFC) circuit as defined in claim 1 wherein said means for detecting sync pulses includes a sync pulse separation means coupled to said video amplifier stage and a sync pulse detector stage coupled to said sync pulse separation means and to said signal combining means.

3. An automatic frequency control (AFC) circuit as defined in claim 1 wherein said signal combining means includes an amplifier stage having an output electrode coupled to a potential source and to said tuner stage, a first input electrode coupled to said discriminator means, and a second input electrode coupled to said means for detecting sync pulses.

4. An automatic frequency control (AFC) circuit as defined in claim 3 wherein said discriminator means includes a bias development means for effecting saturation conduction of said amplifier stage for error signals indicative of frequencies below the desired tuning frequency.

5. An automatic frequency control (AFC) circuit as defined in claim 4 wherein said bias development means includes a pair of resistors series coupling a potential source to a potential reference level.

6. An automatic frequency control (AFC) circuit for a signal receiver having an intermediate frequency (IF) amplifier stage coupling a tuner stage to a detector stage with a video amplifier stage coupling the detector stage to a cathode ray tube and to a sync pulse separation means comprising:
   discriminator means coupled to said IF amplifier stage and including a bias development means;
   means coupled to said video amplifier stage for detecting sync pulses; and
   signal combining means coupled to said discriminator means, to said means for detecting sync pulses, and to said tuner stage for coupling of an error signal from said discriminator means to said tuner stage to cause alteration in tuning frequency with a given "pull-in" range of said tuner stage and an increase of said "pull-in" range upon a loss of a signal from said means for detecting sync pulses.

7. An automatic frequency control (AFC) circuit as defined in claim 6 wherein said bias development means of said discriminator means causes saturation conduction of said signal combining means for error signals indicative of frequencies below the desired tuning frequency.

8. An automatic frequency (AFC) circuit as defined in claim 6 wherein said signal combining means includes a transistor having a base electrode coupled to said discriminator means, an emitter electrode coupled to said means for detecting sync pulses, and a collector electrode coupled to a potential source and to said tuner stage.

9. An automatic frequency control (AFC) circuit as defined in claim 6 wherein said means for detecting sync pulses includes said sync pulse separation means and a detector stage coupled to said sync pulse separation means and to said signal combining means.

* * * * *